(12) United States Patent
Chen et al.

(10) Patent No.: US 10,164,002 B2
(45) Date of Patent: Dec. 25, 2018

(54) SEMICONDUCTOR DEVICE AND LAYOUT METHOD

(71) Applicant: TAIWAN SEMICONDUCTOR MANUFACTURING COMPANY LTD., Hsinchu (TW)

(72) Inventors: Wan-Te Chen, Taipei County (TW); Chung-Hui Chen, Hsinchu (TW); Chii-Ping Chen, Hsinchu (TW); Chung-Yi Lin, Hsinchu County (TW); Wen-Sheh Huang, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 23 days.

(21) Appl. No.: 15/434,972

(22) Filed: Feb. 16, 2017

(65) Prior Publication Data
US 2018/0151665 A1 May 31, 2018

Related U.S. Application Data

(60) Provisional application No. 62/427,640, filed on Nov. 29, 2016.

(51) Int. Cl.
| | | |
|---|---|---|
| *H01L 21/02* | (2006.01) | |
| *H01L 49/02* | (2006.01) | |
| *H01L 27/02* | (2006.01) | |
| *H01L 51/05* | (2006.01) | |
| *H01L 29/8605* | (2006.01) | |
| *H01L 27/08* | (2006.01) | |

(52) U.S. Cl.
CPC .......... *H01L 28/20* (2013.01); *H01L 27/0207* (2013.01); *H01L 27/0802* (2013.01); *H01L 28/00* (2013.01); *H01L 29/8605* (2013.01); *H01L 51/05* (2013.01)

(58) Field of Classification Search
CPC ......... H01L 27/0688; H01L 21/823437; H01L 21/823475; H01L 21/31144; H01L 21/76877; H01L 21/76802; H01L 21/31111; H01L 21/84; H01L 29/66545; H01L 21/823418
USPC ....................................................... 257/538
See application file for complete search history.

(56) References Cited

U.S. PATENT DOCUMENTS

| | | | | |
|---|---|---|---|---|
| 6,034,882 A * | 3/2000 | Johnson | ............... | G11C 11/5692 257/E27.073 |
| 6,291,873 B1 * | 9/2001 | Hidaka | .................... | H01L 28/20 257/538 |
| 7,528,405 B2 * | 5/2009 | Rinerson | ............. | G11C 11/5685 257/41 |
| 8,823,137 B2 * | 9/2014 | Kikuchi | .............. | H01L 27/0802 257/536 |

* cited by examiner

*Primary Examiner* — Vu A Vu
(74) *Attorney, Agent, or Firm* — WPAT, P.C., Intellectual Property Attorneys; Anthony King

(57) ABSTRACT

A semiconductor device is disclosed. The semiconductor device includes a first set of conductive layers coupled with an active device, a second set of conductive layers for connection to an external device, a set of intermediate conductive layers between the first set of conductive layers and the second set of conductive layers, and a resistive layer disposed in the set of intermediate conductive layers.

20 Claims, 13 Drawing Sheets

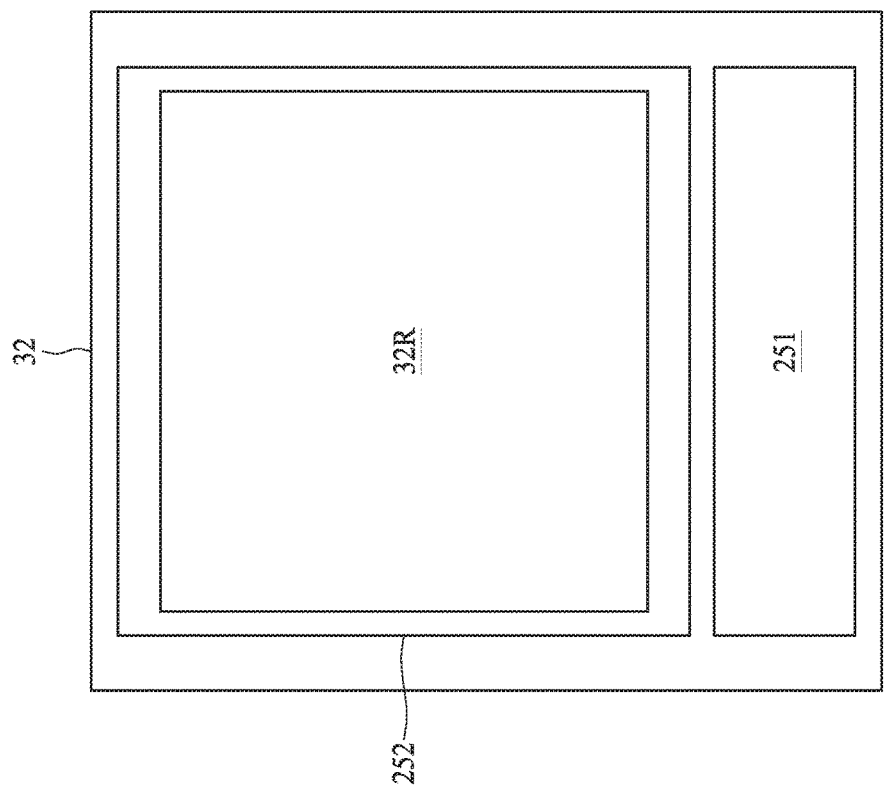

SEMICONDUCTOR DEVICE AND LAYOUT METHOD

CROSS REFERENCE TO RELATED APPLICATIONS

This application claims priority to U.S. provisional application Ser. No. 62/427,640, filed Nov. 29, 2016. All of the above-referenced applications are hereby incorporated herein by reference in their entirety.

BACKGROUND

A semiconductor die in a layout may include an analog area, a digital area and a memory area. Resistors are added in the die in order to reduce noise and minimize faster etching in large areas. These resistors may occupy 5% or more of the analog area, or 1% to 2% of the die area. With the exponential growth in the semiconductor integrated circuit (IC) industry, technological advances in IC materials and design have produced generations of ICs where each generation has smaller and more complex circuits than the previous generation. In the course of IC evolution, functional density has generally increased while geometry size has decreased. This scaling down process generally provides benefits by increasing production efficiency and lowering associated costs. The layout of resistors has been taken into consideration for an efficient area cost in advanced semiconductor process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a schematic top view of a layout of a semiconductor device in accordance with some embodiments.

DETAILED DESCRIPTION

Figure 1:
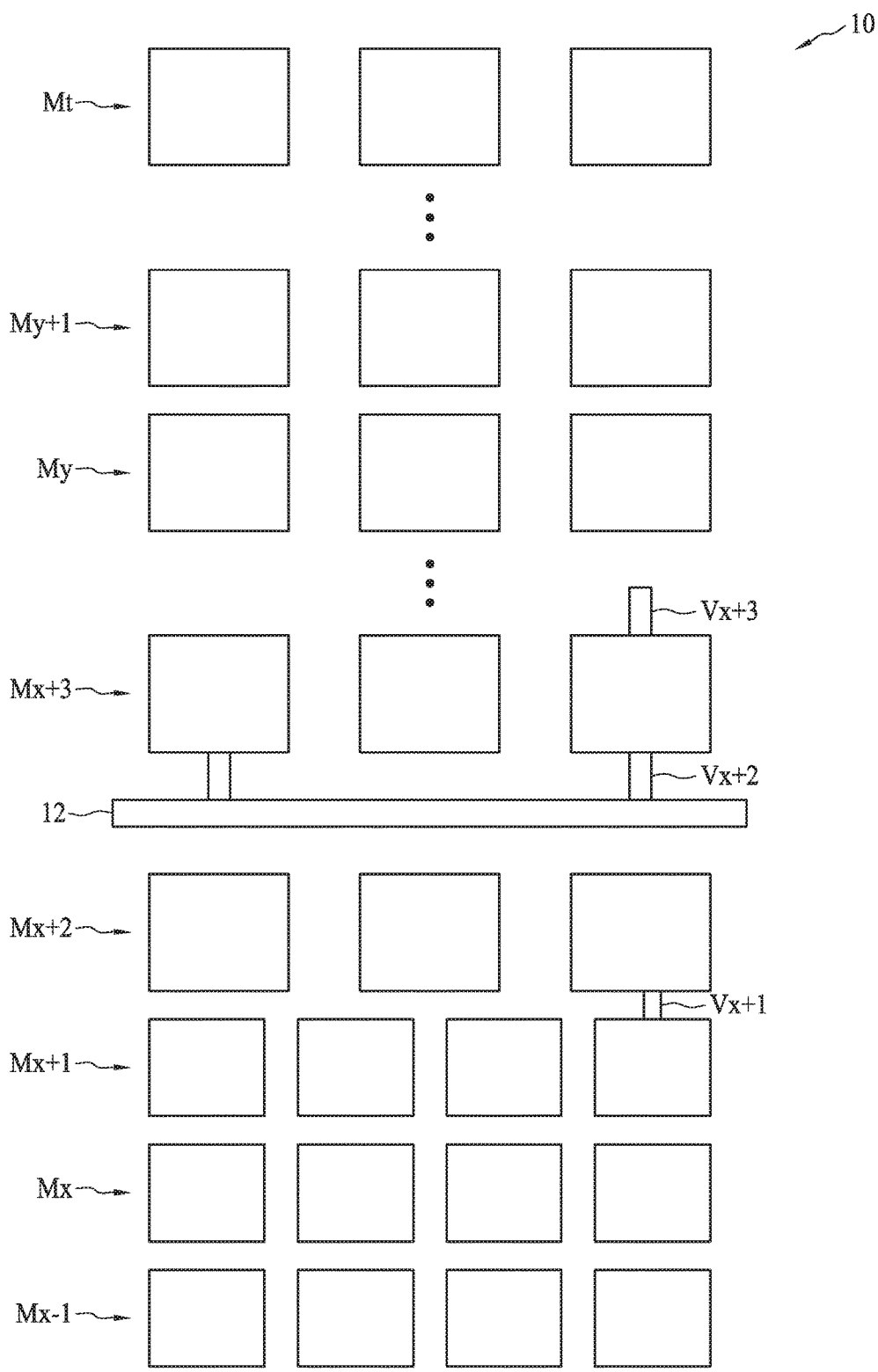
FIG. 1 is a cross-sectional view of a semiconductor device, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a semiconductor device 10, in accordance with an embodiment. Referring to FIG. 1, the semiconductor device 10 includes conductive layers $Mx-1$, $Mx$, $Mx+1$, $Mx+2$, $Mx+3$, $My$, $My+1$, $Mt$, and a resistive layer 12. For brevity, only some exemplary conductive layers such as those labeled in FIG. 1 are shown. In addition, insulating or dielectric layers to electrically isolate one conductive layer from another are omitted. Each of these conductive layers may be formed in a pattern, as represented by separate blocks in FIG. 1. In an embodiment, x equals one (1). The lower conductive layers, for example, $Mx-1$, $Mx$ and $Mx+1$ (i.e., M0, M1 and M2, respectively) are coupled with active devices such as metal-oxide-semiconductor (MOS) transistors or MOS field-effect transistors (MOSFETs) formed in an active region of a substrate (not shown) under the conductive layer $Mx-1$. For example, the conductive layer M0 is mostly responsible for contact with source and drain of a transistor, while the conductive layers M1 and M2 are reserved for routing the source and drain contacts. Conductive layers having a higher level of hierarchy above M2 are intermediate conductive layers. The intermediate conductive layers, for example, $Mx+3$, $My$ and $My+1$ are configured for wire routing through conductive vias $Vx+1$, $Vx+2$ and $Vx+3$. The conductive layer $Mt$ is configured to electrically communicate the semiconductor device 10 with another semiconductor device or a circuit board through conductive pads defined in the conductive layer $Mt$ for power connection or signal transmission. In an embodiment, the conductive layer $Mt$ may include one or more layers. For convenience, only the topmost layer is illustrated.

The resistive layer 12 includes a number of resistors. In an embodiment, the resistors are configured to serve as high value resistors. Suitable materials for the resistors may include titanium nitride (TiN), tantalum nitride (TaN) or polysilicon. The resistive layer 12 may be formed in a thin film by a deposition process. Accordingly, the resistors may function to serve as high value thin film resistors. The resistive layer 12 is disposed between intermediate conductive layers, which in turn are between the lower conductive layers for connection to devices underneath the resistive layer 12 and the upper conductive layer(s) for connection to other resistive layers 12, device or metal bond pads. In the present embodiment, the resistive layer 12 is disposed between a third conductive layer M3 and the top conductive layer Mt. Advantages of disposing the resistive layer between the M3 and Mt layers are discussed with reference to FIGS. 2 and 3 below.

Figure 2:
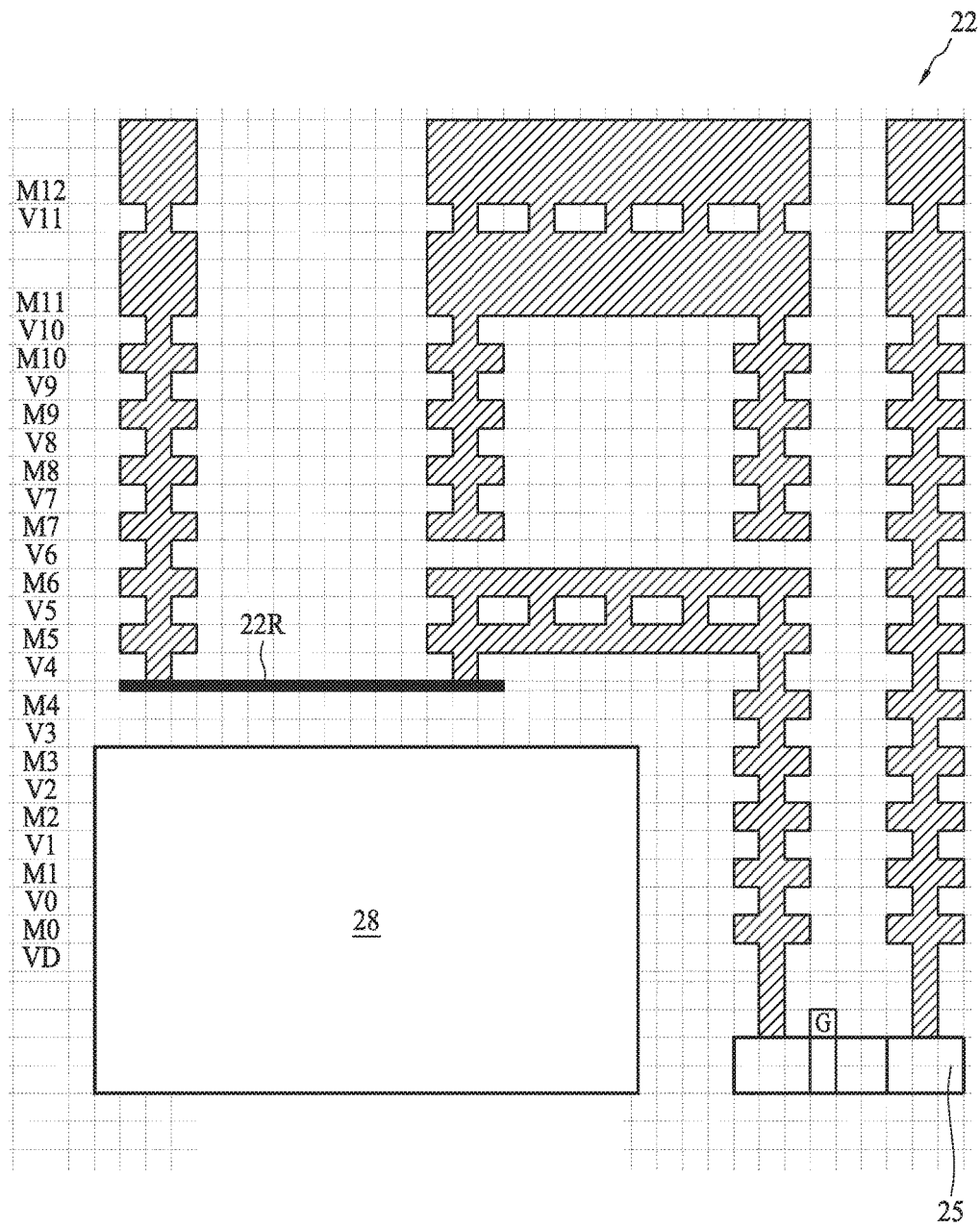
FIG. 2 is a cross-sectional view of a layout of a semiconductor device in accordance with some embodiments.

FIG. 2 is a cross-sectional view of a layout of a semiconductor device 22 in accordance with some embodiments. Referring to FIG. 2, in the semiconductor device 22 in accordance with some embodiments, a resistive layer 22R is disposed in intermediate conductive layers. Specifically, the resistive layer 22R is disposed between a fourth conductive layer M4 and a fifth conductive layer M5. By comparison, in some existing semiconductor devices, a resistive layer is disposed at a level between a lower conductive layer M0 or M1 and a gate of a transistor 25. In other existing semiconductor devices, the resistive layer may be disposed at the same level as the gate of the transistor 25. Either way, such a layout may not be compatible with an advanced semiconductor process, such as the 7-nanometer (N7) process or 5-nanometer (N5) process. As compared to the resistive layer of the existing semiconductor devices, the resistive layer 22R is elevated to a higher level between the conductive layers M3 and Mt. As a result, a space 28 under the resistive layer 22R is created, which makes room for additional semiconductor devices. Effectively, more MOSFETs can be formed in the created space 28. The semiconductor device 22 thus has a more efficient area cost than the existing semiconductor devices.

As previously discussed, the conductive layer Mt may include one or more conductive layers. In the present embodiment, the conductive layer Mt includes a topmost conductive layer M12 and an adjacent conductive layer M11 immediately under the topmost conductive layer M12. The upper conductive layers M12 and M11 are several times thicker than the other conductive layers.

FIG. 3 is a schematic layout top view of a layout of a semiconductor device 32 in accordance with some embodiments. Referring to FIG. 3, in the semiconductor device 32 in accordance with some embodiments, a resistive layer 32R is disposed in intermediate conductive layers over an active area. By comparison, in some existing semiconductor devices, a resistive layer is disposed beside or at the same level as the active area where transistors are formed. In addition, the resistive layer in the existing semiconductor devices may have substantially the same dimension as the resistive layer 32R in FIG. 3. As a result, by disposing the resistive layer 32R over the active area, the transistors 251 and 252 may be formed under the resistive layer 32R. Effectively, an area required to accommodate the resistive layer 32R and transistors 251, 252 is reduced. The semiconductor device 32 thus has a more efficient area cost than the existing semiconductor devices.

Figure 4A:
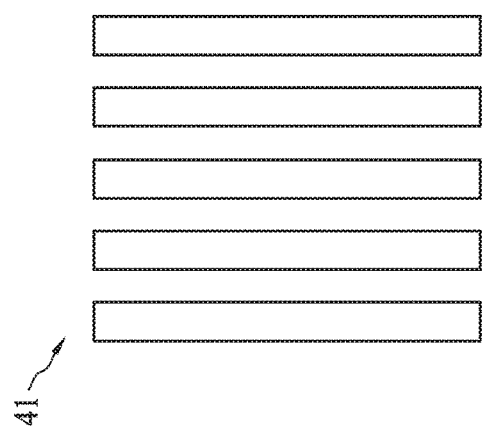
FIGS. 4A and 4B are layout examples of one-dimensional (1D) conductive layers.
Figure 4B:
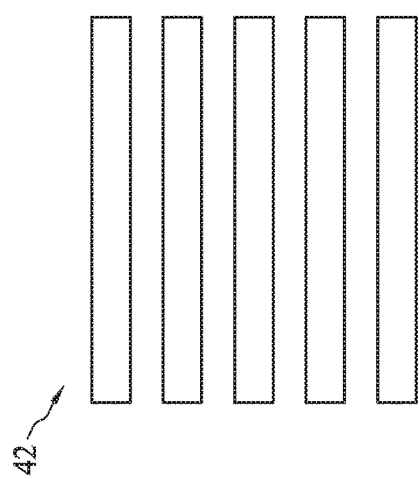

FIGS. 4A and 4B are layout examples of one-dimensional (1D) conductive layers. A 1D conductive layer refers to a conductive layer that extends in a single direction. Referring to FIG. 4A, a 1D conductive layer 41 extends in a vertical direction. Referring to FIG. 4B, a 1D conductive layer 42 extends in a horizontal direction. In an embodiment, the lower conductive layers such as Mx−1, Mx and Mx+1 as described and illustrated with reference to FIG. 1 may take the form of a 1D conductive layer.

Figure 4C:
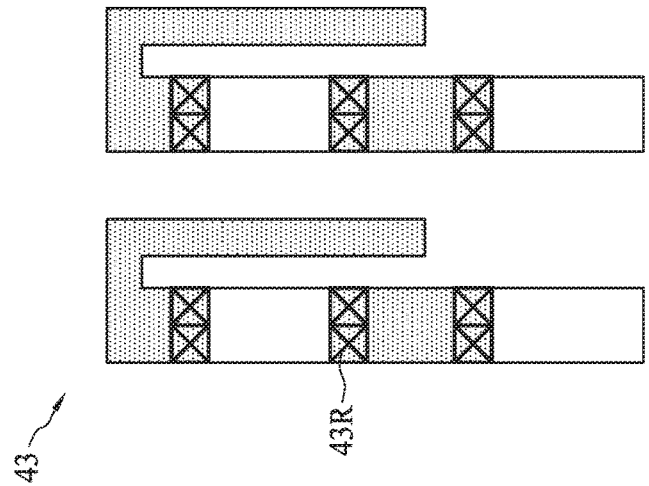
FIG. 4C is a layout example of a two-dimensional (2D) conductive layer.

FIG. 4C is a layout example of a two-dimensional (2D) conductive layer 43. A 2D conductive layer refers to a conductive layer that extends in more than one direction. Referring to FIG. 4C, the 2D conductive layer 43 includes a pattern having a first leg (not numbered) that extends in a vertical direction and a second leg (not numbered) that extends in a horizontal direction. In an embodiment, the intermediate conductive layers such as Mx+3, My and My+1 as described and illustrated with reference to FIG. 1 may take the form of a 2D conductive layer. A resistive layer including resistors 43R may be disposed over the 2D conductive layer 43.

In some embodiments, as in the embodiment of FIG. 1, a resistive layer 12 may be disposed between a 1D conductive layer and a 2D conductive layer. In other embodiments, as will be discussed with reference to FIG. 5, a resistive layer may be disposed between a 2D conductive layer and another 2D conductive layer.

Figure 5:
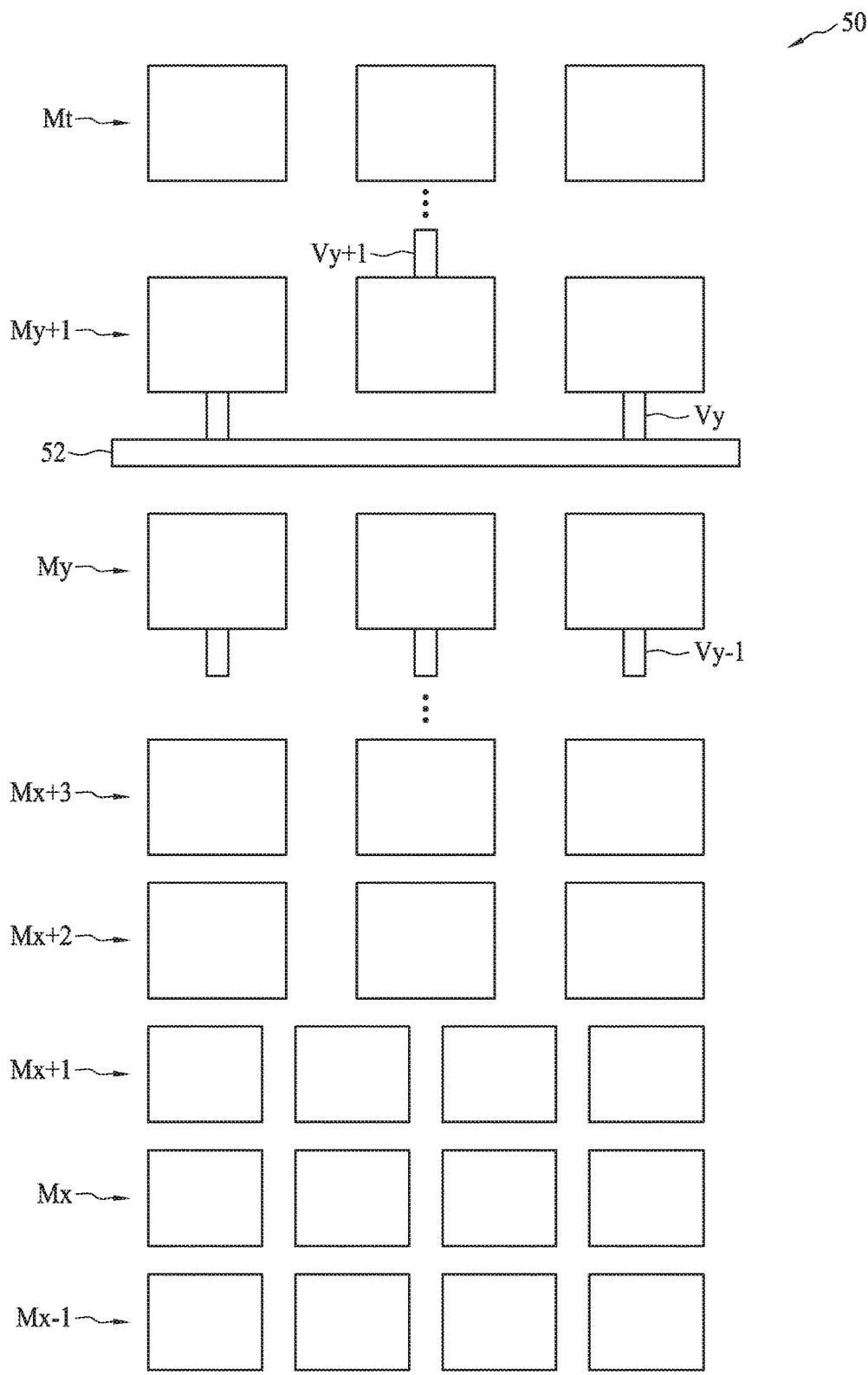
FIG. 5 a cross-sectional view of a semiconductor device, in accordance with another embodiment.

FIG. 5 a cross-sectional view of a semiconductor device 50, in accordance with another embodiment. Referring to FIG. 5, the semiconductor device 50 is similar to the semiconductor device 10 described and illustrated with reference to FIG. 1 except that, for example, a resistive layer 52 is disposed between two 2D conductive layers My and My+1 in the intermediate conductive layers. By disposing the resistive layer 52 in the intermediate conductive layers, more transistors can be formed under the resistive layer 52 given the same die dimension, as in the case of the semiconductor device 22 described and illustrated with reference to FIG. 2, or the die size can be reduced given the same number of transistors being formed, as in the case of the semiconductor device 32 described and illustrated with reference to FIG. 3. Either way, the semiconductor device 50 has a more efficient area cost than the existing semiconductor devices as previously discussed.

Figure 6A:
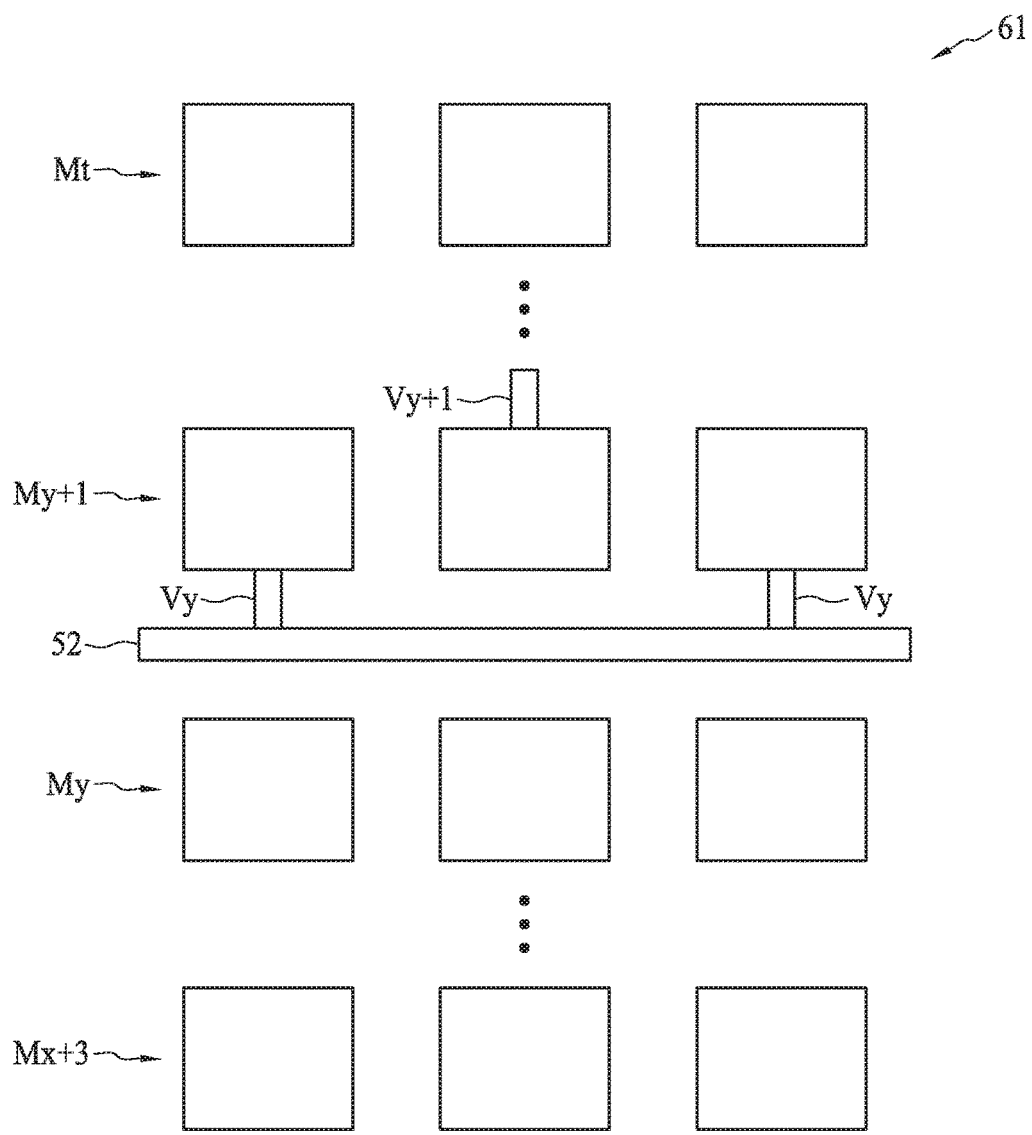
FIGS. 6A to 6D are cross-sectional views of semiconductor devices, in accordance with some embodiments.

FIGS. 6A to 6D are cross-sectional views of semiconductor devices 61 to 64, respectively, in accordance with some embodiments. Referring to FIG. 6A, the semiconductor device 61 is similar to the semiconductor device 50 described and illustrated with reference to FIG. 5 except that, for example, a conductive layer My+1 immediately over the resistive layer 52 is floated. In an embodiment, by disabling vias associated with the conductive layer My+1, except those in contact with the resistive layer 52, the conductive layer My+1 is floated. For example, vias Vy+1 that would connect the conductive layer My+1 to an upper conductive layer are not formed in a semiconductor manufacturing process. A floated conductive layer immediately over the resistive layer 52 facilitates reduction in parasitic capacitance between the conductive layer and the resistive layer 52, which enhances the electrical performance of the semiconductor device 61.

Figure 6B:
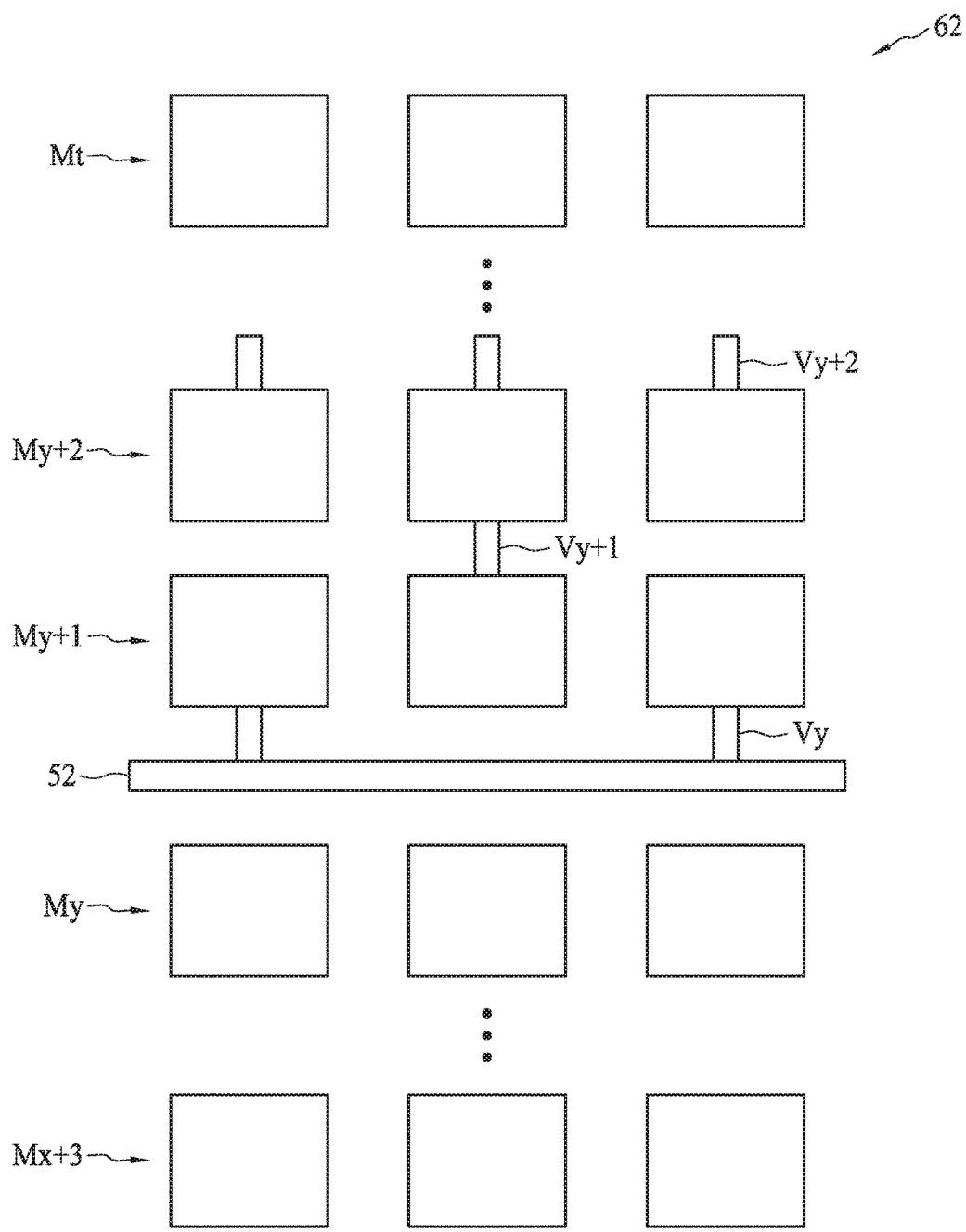

Referring to FIG. 6B, the semiconductor device 62 is similar to the semiconductor device 50 described and illustrated with reference to FIG. 5 except that, for example, conductive layers My+1 and My+2 immediately over the resistive layer 52 are floated. Similarly, by disabling vias associated with conductive layers My+1 and My+2, except those in contact with the resistive layer 52, the conductive layers My+1 and My+2 are floated. For example, vias Vy+1 and Vy+2 that would connect the conductive layers My+1 and My+2 to an upper conductive layer are not formed in a semiconductor manufacturing process. Floated conductive layers immediately over the resistive layer 52 facilitate reduction in parasitic capacitance between the conductive layers and the resistive layer 52, which enhances the electrical performance of the semiconductor device 62.

Figure 6C:
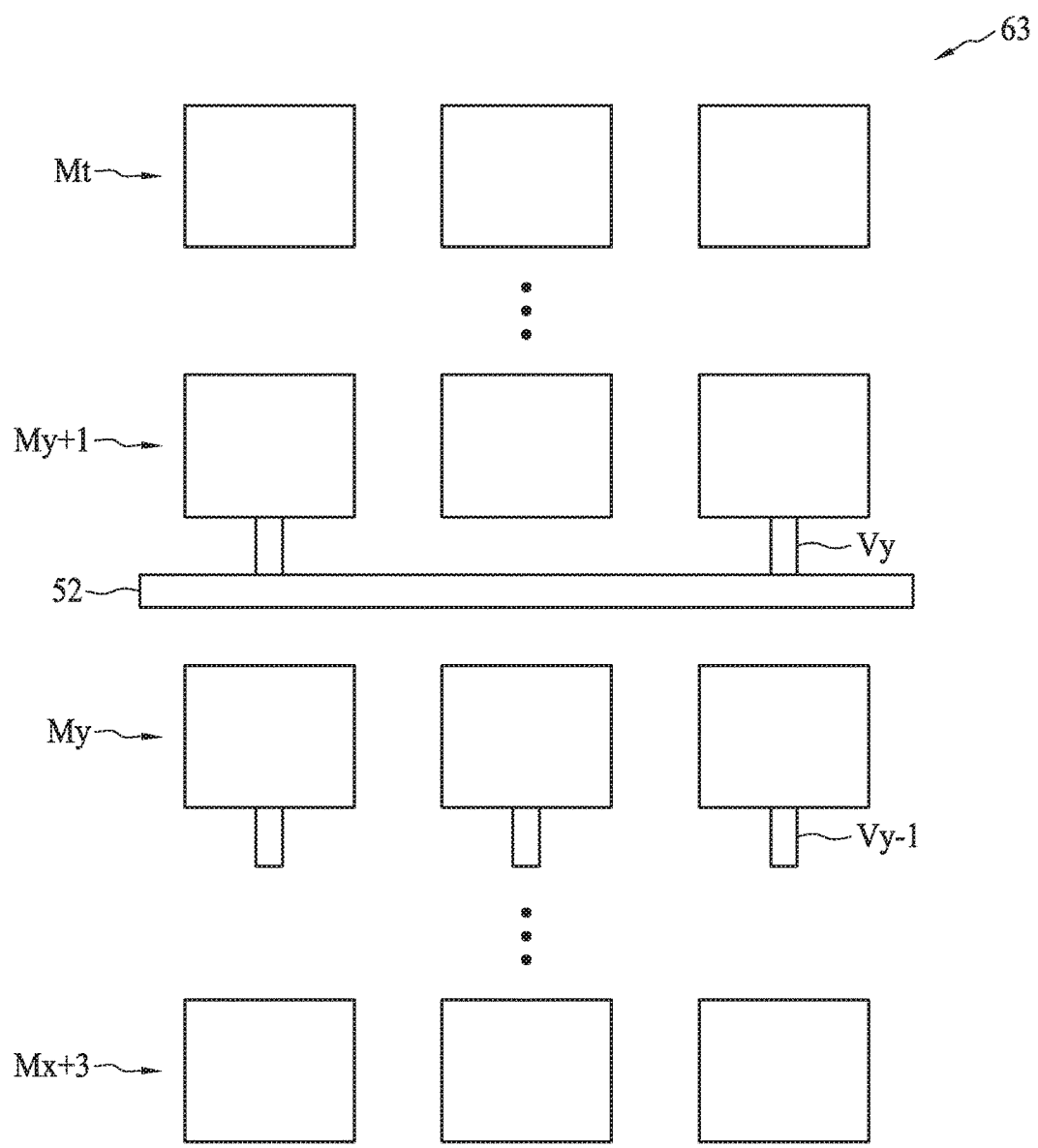

Referring to FIG. 6C, the semiconductor device 63 is similar to the semiconductor device 50 described and illustrated with reference to FIG. 5 except that, for example, a conductive layer My (or Mx) immediately under the resistive layer 52 is floated. In an embodiment, by disabling vias associated with the conductive layer My (or Mx), the conductive layer My (or Mx) is floated. For example, vias Vy−1 (or Vx−1) that would connect the conductive layer My (or Mx) to a lower conductive layer is not formed in a semiconductor manufacturing process. A floated conductive layer immediately under the resistive layer 52 facilitates reduction in parasitic capacitance between the conductive layer and the resistive layer 52, which enhances the electrical performance of the semiconductor device 63.

Figure 6D:
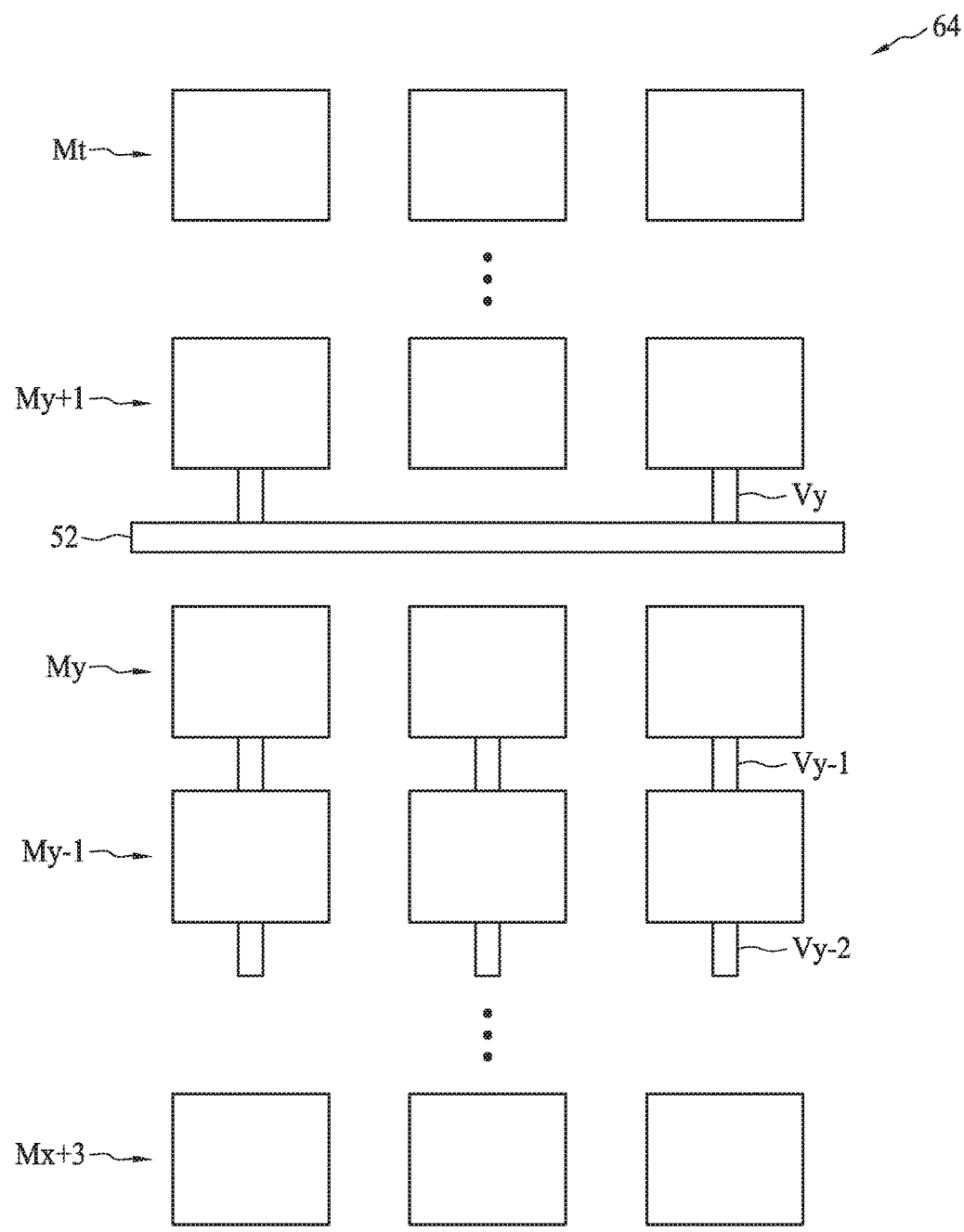

Referring to FIG. 6D, the semiconductor device 64 is similar to the semiconductor device 50 described and illustrated with reference to FIG. 5 except that, for example, conductive layers My (or Mx) and My−1 (or Mx−1) immediately under the resistive layer 52 are floated. Similarly, by disabling vias associated with the conductive layers My (or Mx) and My−1 (or Mx−1), the conductive layers My (or Mx) and My−1 (or Mx−1) are floated. For example, vias Vy−1 (or Vx−1) and Vy−2 (or Vx−2) that would connect the conductive layers My (or Mx) and My−1 (or Mx−1) to a lower conductive layer are not formed in a semiconductor manufacturing process. Floated conductive layers immediately below or under the resistive layer 52 facilitate reduction in parasitic capacitance between the conductive layers and the resistive layer 52, which enhances the electrical performance of the semiconductor device 64.

In another embodiment according to the present disclosure, one conductive layer My+1 disposed immediately over the resistive layer 52 and one conductive layer My (or Mx) disposed immediately under the resistive layer 52 are floated.

In still another embodiment according to the present disclosure, two conductive layers My+1 and My+2 disposed immediately over the resistive layer 52 and one conductive layer My (or Mx) disposed immediately under the resistive layer 52 are floated.

In yet another embodiment according to the present disclosure, one conductive layer My+1 disposed immediately over the resistive layer 52 and two conductive layers My (or Mx) and My−1 (or Mx−1) disposed immediately under the resistive layer 52 are floated.

In yet still another embodiment according to the present disclosure, two conductive layers My+1 and My+2 disposed immediately over the resistive layer 52 and two conductive layers My (or Mx) and My−1 (or Mx−1) disposed immediately under the resistive layer 52 are floated.

In the above-mentioned embodiments, one or two conductive layers disposed immediately over the resistive layer 52, or one or two conductive layers disposed immediately under the resistive layer 52, or both, are floated. In other embodiments, however, three or more conductive layers disposed immediately over the resistive layer 52, or three or more conductive layers disposed immediately under the resistive layer 52, or both, are floated if circuit design or layout permits.

In some existing semiconductor devices, since a resistive layer is disposed near a substrate, no conductive layers below the resistive layer can be floated. As a result, as compared to the existing semiconductor devices, a semiconductor device according to the present disclosure, by floating at least a conductive layer disposed immediately over or under a resistive layer, is able to reduce parasitic capacitance and hence enhance the electrical performance.

Figure 7:
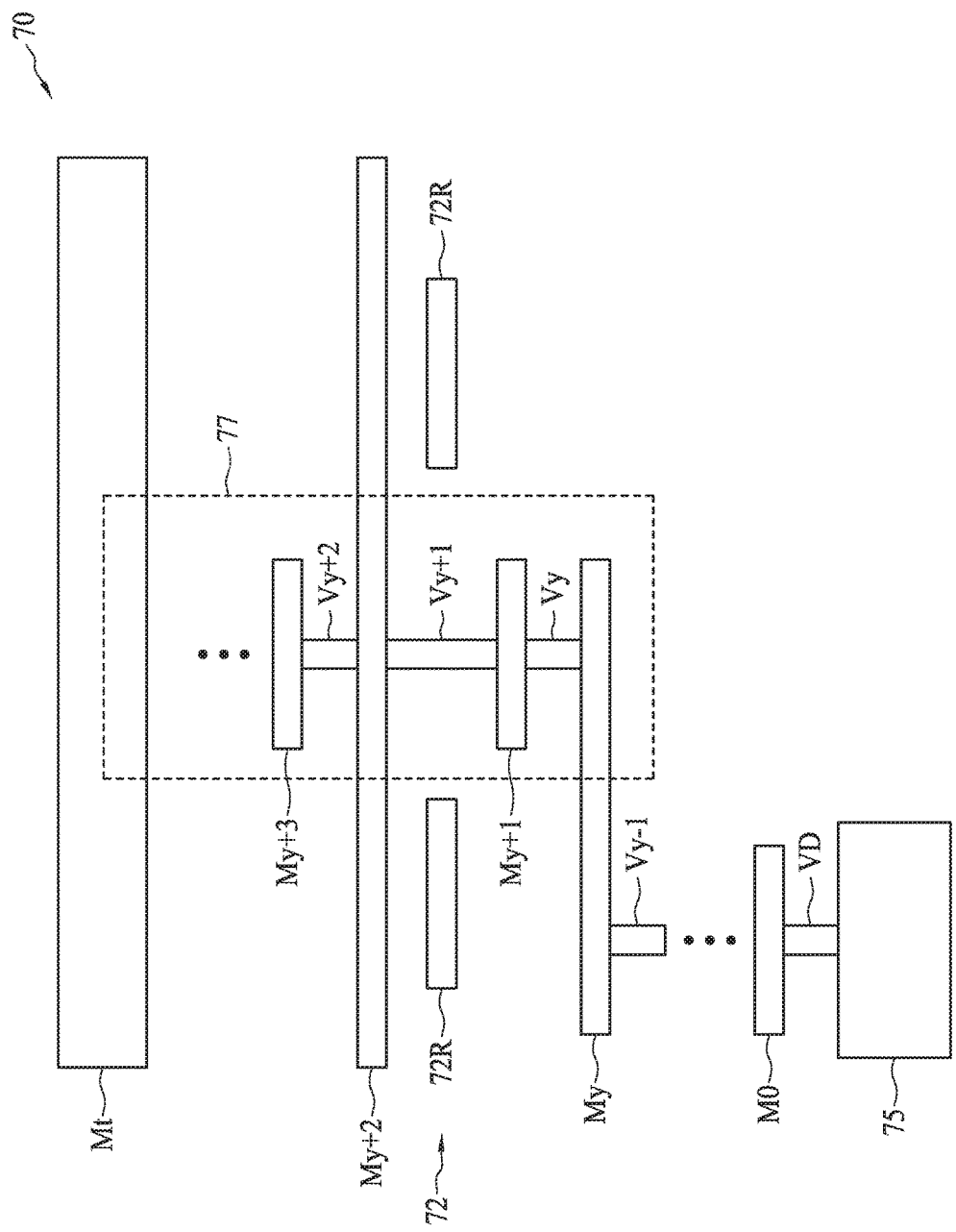
FIG. 7 is a cross-sectional view of a semiconductor device, in accordance with some embodiments.

FIG. 7 is a cross-sectional view of a semiconductor device 70, in accordance with some embodiments. Referring to FIG. 7, the semiconductor device 70 is similar to the semiconductor device 10 described and illustrated with reference to FIG. 1 except that, for example, a conductive path 77 between an active device 75 and the conductive layer Mt is shown. In addition, the conductive path 77 extends between resistors 72R of a resistive layer 72. The conductive path 77 electrically connects the active device 75 such as a transistor to the conductive layer Mt on which power pads, ground pads and signal pads are formed. Moreover, the conductive path 77 includes a via tower that includes, for example, vias Vy, Vy+1, Vy+2 and conductive layers that includes, for example, My, My+1, My+2, My+3.

Figure 8:
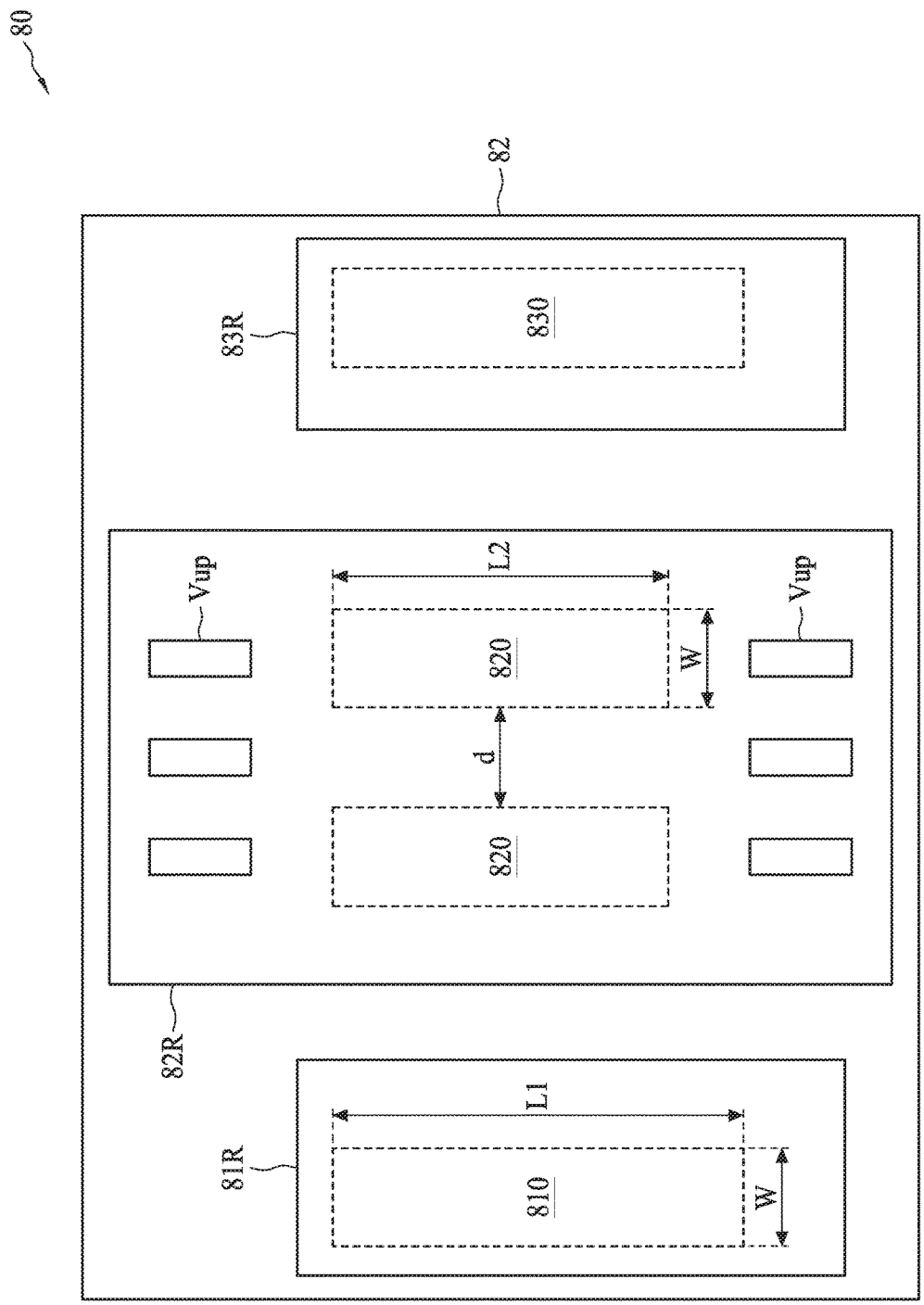
FIG. 8 is a layout top view of a semiconductor device, in accordance with some embodiments.

FIG. 8 is a top view of a semiconductor device 80, in accordance with some embodiments. Referring to FIG. 8, the semiconductor device 80 includes a resistive layer 82, which further includes resistors 81R, 82R and 83R. As previously discussed, since the resistive layer 82 is disposed in the intermediate conductive layers, active devices and associated lower conductive layers may be formed below. For convenience, only the resistor 82R is illustrated in detail, even though the resistors 81R and 83R have a similar structure. The resistor 82R is electrically connected to an upper conductive layer (not shown) through vias Vup. In the present embodiment, regions 820 shown in dashed boxes under the resistor 82R may each represent one of an active diffusion area, a poly or metal gate structure and a lower conductive layer. The regions 820 are configured with a predetermined pattern style, which defines dimensional features of the regions 820 and other similar regions under the resistor 82R. For example, the regions 820 have a width of w, a length of L2 and are separated from each other by a spacing d according to the predetermined pattern style. Moreover, some dimensional features of the predetermined pattern style are applicable to the remaining resistors including the resistors 81R and 83R. For example, a region 810 under the resistor 81R has the same width w and is separated from an immediately adjacent region (not shown) under the resistor 81R by the same spacing d. However, the region 810 has a length L, which may be different from L2 in that the resistors 81R and 82R have different resistances. The predetermined pattern style ensures a constant resistance in individual resistors 81R, 82R, 83R and uniform evenness of the resistive layer 82. As a result, mismatch due to process factors can be alleviated.

Figure 9:
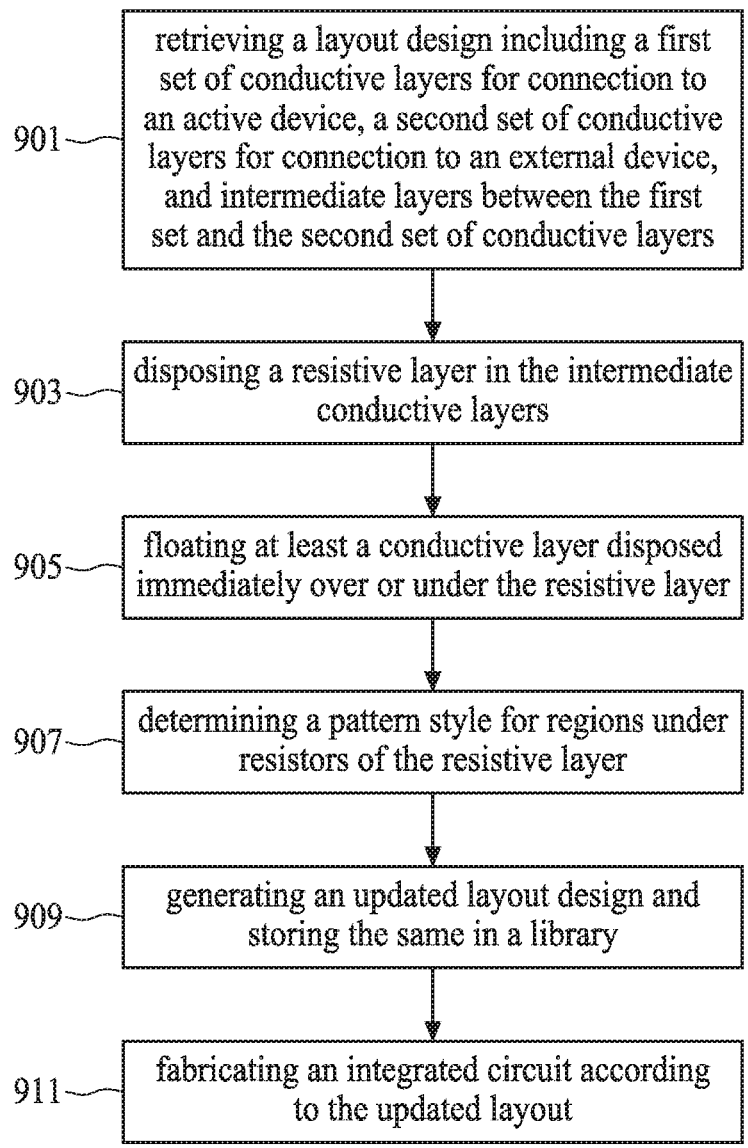
FIG. 9 is a flow diagram showing a layout method, in accordance with some embodiments.

FIG. 9 is a flow diagram showing a layout method, in accordance with some embodiments. Referring to FIG. 9, in operation 901, a layout design is retrieved from a library. The layout design includes a first set of conductive layers for connection to an active device, a second set of conductive layers for connection to an external device, and intermediate layers between the first set and the second set of conductive layers. The first set of conductive layers may include conductive layers M0, M1 and M2 associated with the active device. The second set of conductive layers may include one or more conductive layers such as M11 and M12 as illustrated in FIG. 2.

In operation 903, a resistive layer is disposed in the intermediate conductive layers. In an embodiment, the resistive layer is disposed between a third conductive layer M3 immediately above the second conductive layer M2 and a top conductive layer Mt on which power pads or signal pads are formed.

In operation 905, to enhance electrical performance, at least a conductive layer disposed immediately over or under the resistive layer is floated.

In operation 907, to alleviate mismatch issue, a pattern style for regions under resistors of the resistive layer is determined. The pattern style defines dimensional features for the regions under the resistive layer. In an embodiment, the regions may include one of an active diffusion region, a poly or metal gate region and a lower conductive layer.

Moreover, the dimensional features may include a substantially identical width of the regions and a substantially identical spacing between regions under a resistor. Further, the order of the operation 905 and the operation 907 is interchangeable.

In operation 909, after operations 901, 903, 905 and 907, an updated layout design is generated. The updated layout design is subsequently stored in the library.

In operation 911, an integrated circuit may be fabricated according to the updated layout. The layout method described and illustrated with reference to FIG. 9 can thus be used for physical implementation.

Effectively, the layout method according to the present disclosure improves a layout of an integrated circuit. The layout method is executable by a processor, and may be compiled in a computer readable program. In addition, the computer readable program may be stored in a memory device. Also, the processor may read or reload the computer readable program from the memory device in order to execute the layout method upon the layout of an integrated circuit. The layout of the integrated circuit is composed of a plurality of standard cells. Standard cells are typically pre-designed and stored in cell libraries.

In general, the layout method is designed to dispose a resistive layer, which may include high-speed thin film resistors, in the layout of an integrated circuit. In an embodiment, the resistive layer is disposed between conductive layers M3 and Mt. In another embodiment, the resistive layer is disposed between a 1D conductive layer and a 2D conductive layer. In still another embodiment, the resistive layer is disposed between a 2D conductive layer and another 2D conductive layer.

The layout method is also designed to float at least a conductive layer associated with the resistive layer so as to alleviate parasitic capacitance effect. In an embodiment, one or more conductive layers in a hierarchy structure disposed immediately over the resistive layer are floated. In another embodiment, one or more conductive layers in a hierarchy structure disposed immediately under the resistive layer are floated. In still another embodiment, one or more conductive layers in a hierarchy structure disposed immediately over the resistive layer and one or more conductive layers in a hierarchy structure disposed immediately under the resistive layer are floated.

The layout method is also designed to determine a pattern style for regions disposed under the resistive layer so as to alleviate mismatch issue. The pattern style includes dimensional features for the regions.

Figure 10:
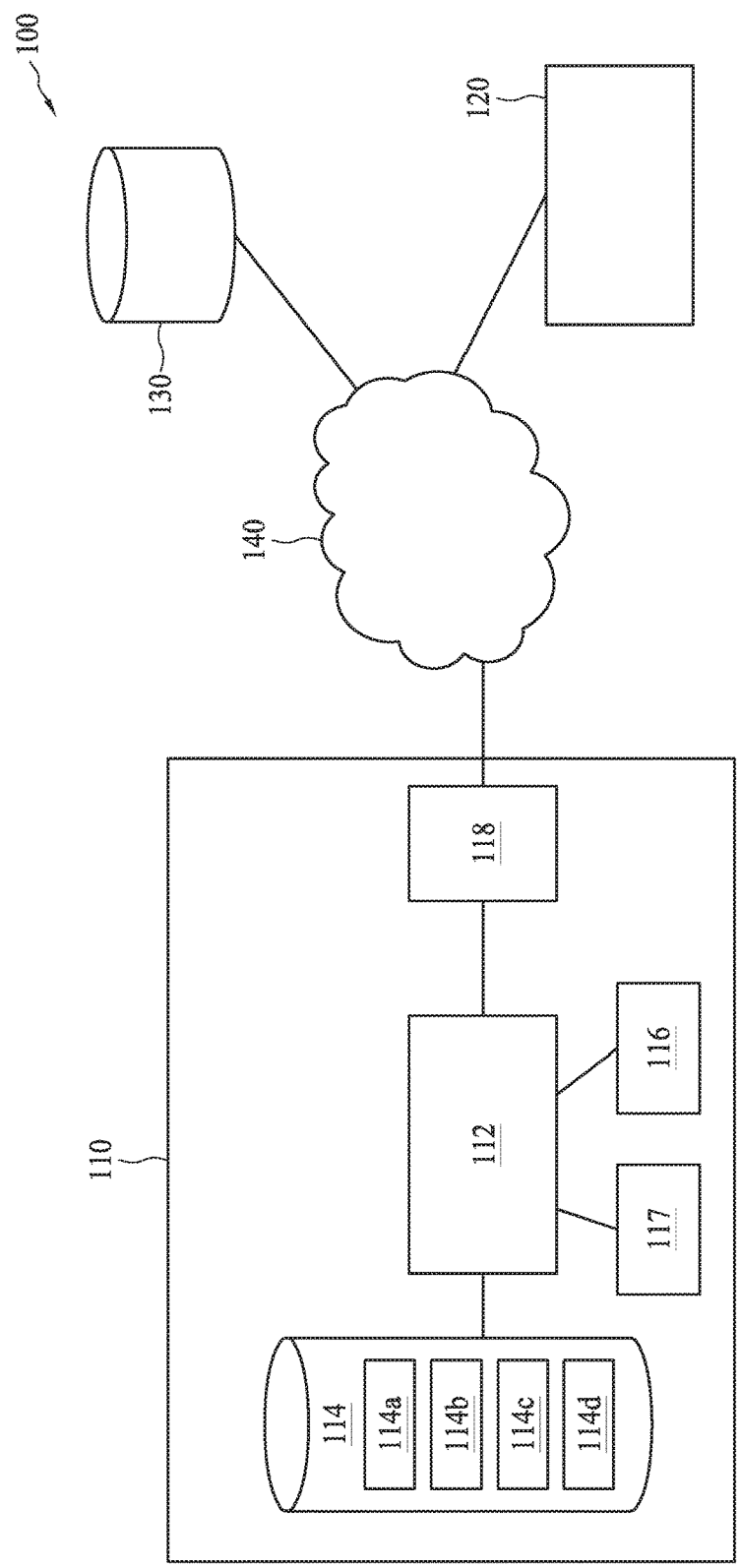
FIG. 10 is a functional block diagram of a system for layout design, in accordance with some embodiments.

FIG. 10 is a functional block diagram of a system 100 for layout design, in accordance with some embodiments. Referring to FIG. 10, the system 100 includes a first computer system 110, a second computer system 120, a networked storage device 130, and a network 140 connecting the first computer system 110, the second computer system 120 and the networked storage device 130. In some embodiments, one or more of the second computer system 120, the storage device 130, and the network 140 may be omitted. In some embodiments, two or more of the first computer system 110, the second computer system 120 and the storage device 130 may be integrated into a single computer system.

The first computer system 110 includes a hardware processor 112 and a non-transitory, computer readable storage medium 114. The hardware processor 112 is electrically and communicatively coupled with the non-transitory, computer readable storage medium 114. The computer readable storage medium 114 is encoded with, or storing, a generated integrated layout 114a, a circuit design 114b, a computer program code 114c including a set of executable instructions, and a standard cell library 114d having layout patterns. The processor 112 is configured to execute the set of instructions 114c encoded in the computer readable storage medium 114 in order to cause the first computer system 110 to be usable as a placing and routing tool for generating a layout design based on the standard cell library 114d. The processor 112 is also configured to execute the set of instructions 114c encoded in the computer readable storage medium 114 in order to cause the first computer system 110 to perform the operations 901 to 909 the layout method as described and illustrated with reference to FIG. 9.

In some embodiments, the standard cell library 114d is stored in the non-transitory storage medium other than storage medium 114. In some embodiments, the standard cell library 114d is stored in a non-transitory storage medium in the networked storage device 130 or the second computer system 120. In that case, the standard cell library 114d is accessible by the processor 112 through the network.

In some embodiments, the processor 112 is a central processing unit (CPU), a multi-processor, a distributed processing system, an application specific integrated circuit (ASIC), and/or a suitable processing unit.

In some embodiments, the computer readable storage medium 114 is an electronic, magnetic, optical, electromagnetic, infrared, and/or a semiconductor system (or apparatus or device). For example, the computer readable storage medium 114 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2314 includes a compact disk-read only memory (CD-ROM), a compact disk-read/write (CD-R/W), and/or a digital video disc (DVD).

The first computer system 110 includes, in at least some embodiments, an input/output (I/O) interface 116, a display unit 117 and a network interface 118. The input/output interface 116 is coupled to the processor 112 and allows a circuit designer to manipulate the first computer system 110. In at least some embodiments, the display unit 117 displays the status of executing the placing and routing tool 114a in a real-time manner and provides a Graphical User Interface (GUI). In at least some embodiments, the input/output interface 116 and the display 117 allow a user to operate the first computer system 110 in an interactive manner. The network interface 118 enables the first computer system 110 to communicate with the network 140.

In some embodiments, the present disclosure provides a semiconductor device. The semiconductor device includes a first set of conductive layers coupled with an active device, a second set of conductive layers for connection to an external device, a set of intermediate conductive layers between the first set of conductive layers and the second set of conductive layers, and a resistive layer disposed in the set of intermediate conductive layers.

In some embodiments, the present disclosure also provides a semiconductor device. The semiconductor device includes a first set of conductive layers coupled with an active device, a set of intermediate conductive layers disposed over the first set of conductive layers, and a resistive layer disposed in the set of intermediate conductive layers. At least a conductive layer in a hierarchy structure disposed immediately adjacent to the resistor layer is floated.

In some embodiments, the present disclosure provides a layout method. The layout method includes retrieving from a library a layout design including a first set of conductive layers for connection to an active device, a second set of conductive layers for connection to an external device, and intermediate layers between the first set and the second set of conductive layers, and disposing a resistive layer in the intermediate conductive layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first set of conductive layers coupled with an active device;
   a second set of conductive layers for connection to an external device;
   a set of intermediate conductive layers between the first set of conductive layers and the second set of conductive layers; and
   a resistive layer disposed in the set of intermediate conductive layers, wherein the resistive layer is disposed immediately between one of the set of intermediate conductive layers and another of the set of intermediate conductive layers, wherein the resistive layer is free of coupling the one of the set of the intermediate conductive layers to the another of the set of intermediate conductive layers.

2. The semiconductor device according to claim 1, wherein the first set of conductive layers includes a first conductive layer over a gate of the active device, a conductive layer between the gate and the first conductive layer, and a second conductive layer disposed immediately over the first conductive layer.

3. The semiconductor device according to claim 2, wherein the resistive layer is disposed between a third conductive layer disposed immediately over the second conductive layer and the second set of conductive layers.

4. The semiconductor device according to claim 1, wherein the resistive layer is disposed between a one-dimensional conductive layer and a two- dimensional conductive layer.

5. The semiconductor device according to claim 1, wherein the resistive layer is disposed between a two-dimensional conductive layer and another two-dimensional conductive layer.

6. The semiconductor device according to claim 1, wherein the resistive layer includes thin film resistors.

7. The semiconductor device according to claim 6, wherein the resistors include a material selected from titanium nitride, tantalum nitride or polysilicon.

8. The semiconductor device according to claim 6, wherein a first region under one of the resistors and a second region under the one resistor have the same dimensional features in accordance with a predetermined pattern style.

9. The semiconductor device according to claim 1, wherein at least a conductive layer in a hierarchy structure disposed immediately adjacent to the resistive layer is floated.

10. The semiconductor device according to claim 1, wherein at least a conductive layer disposed immediately under the resistive layer is floated.

11. A semiconductor device, comprising:
    a first set of conductive layers coupled with an active device;
    a set of intermediate conductive layers disposed over the first set of conductive layers; and
    a resistive layer disposed in the set of intermediate conductive layers,
    wherein at least a conductive layer in a hierarchy structure disposed immediately adjacent to the resistor layer is floated.

12. The semiconductor device according to claim 11, wherein at least a conductive layer disposed immediately over the resistor layer is floated.

13. The semiconductor device according to claim 11, wherein at least a conductive layer disposed immediately under the resistor layer is floated.

14. The semiconductor device according to claim 11, wherein at least a conductive layer disposed immediately over the resistor layer and at least a conductive layer disposed immediately under the resistor layer are floated.

15. The semiconductor device according to claim 11 further comprising a second set of conductive layers for connection to an external device, wherein the set of intermediate conductive layers is disposed between the first set of conductive layers and the second set of conductive layers.

16. The semiconductor device according to claim 11, wherein the resistive layer includes a number of resistors, wherein a first region under one of the resistors and a second region under the one resistor have the same dimensional features in accordance with a predetermined pattern style.

17. A layout method, comprising:
    retrieving from a library a layout design including a first set of conductive layers for connection to an active device, a second set of conductive layers for connection to an external device, and intermediate conductive layers between the first set and the second set of conductive layers; and
    disposing a resistive layer in the intermediate conductive layers, wherein the resistive layer is free of coupling the one of the set of the intermediate conductive layers to the another of the set of intermediate conductive layers, wherein the resistive layer is disposed immediately between one of the intermediate conductive layers and another of the intermediate conductive layers.

18. The layout method according to claim 17 further comprising floating at least a conductive layer disposed immediately over or under the resistive layer.

19. The layout method according to claim 17 further comprising determining a pattern style for regions under resistors of the resistive layer.

20. The layout method according to claim 17 further comprising generating an updated layout design and storing the same in the library after the operation of disposing a resistive layer in the intermediate conductive layers.

* * * * *